(12) United States Patent
van Engelen et al.

(10) Patent No.: US 8,536,916 B1
(45) Date of Patent: Sep. 17, 2013

(54) DIGITALLY CONTROLLED OSCILLATOR WITH THERMOMETER SIGMA DELTA ENCODED FREQUENCY CONTROL WORD

(75) Inventors: Josephus A. van Engelen, Aliso Viejo, CA (US); Hairong Yu, Tustin, CA (US); Howard A. Baumer, Laguna Hills, CA (US)

(73) Assignee: Entropic Communications, Inc., San Diego, CA (US)

( * ) Notice: Subject to any disclaimer, the term of this patent is extended or adjusted under 35 U.S.C. 154(b) by 0 days.

(21) Appl. No.: 13/612,613

(22) Filed: Sep. 12, 2012

Related U.S. Application Data

(60) Provisional application No. 61/533,768, filed on Sep. 12, 2011.

(51) Int. Cl.
*H03L 7/06* (2006.01)

(52) U.S. Cl.
USPC .......................................... 327/159; 327/150

(58) Field of Classification Search
USPC ................................. 327/148, 159
See application file for complete search history.

(56) References Cited

U.S. PATENT DOCUMENTS

| | | | |
|---|---|---|---|
| 6,658,748 B1* | 12/2003 | Leipold et al. .................. | 331/179 |
| 7,483,508 B2* | 1/2009 | Staszewski et al. ............ | 375/376 |
| 8,193,845 B2* | 6/2012 | Jian et al. ........................ | 327/159 |
| 2007/0146024 A1* | 6/2007 | Allan .............................. | 327/156 |
| 2011/0009083 A1* | 1/2011 | Namba et al. .................. | 455/318 |
| 2012/0007643 A1* | 1/2012 | Jian et al. ....................... | 327/157 |
| 2012/0074993 A1* | 3/2012 | Chen et al. ..................... | 327/147 |

OTHER PUBLICATIONS

A. Rylyakov et al., "Bang-Bang Digital PLLs at 11 and 20GHz with sub-200fs Integrated Jitter for High-Speed Serial Communication Applications", ISSCC, Dig. Tech. Papers, 2009, pp. 94-96.

A. Rylyakov et al., "Bang-Bang Digital PPLs at 11 and 20GHz with sub-200fs Integrated Jitter for High-Speed Communication Systems", ISSCC Digest, 2009, Session 5.3, p. 94-95.

Dalt et al., "A Compact Triple-Band Low-Jitter Digital LC PLL with Programmable Coil in 130-nm CMOS", IEEE Journal of Solid-State Circuits, Jul. 2005, vol. 40, No. 7, pp. 1482-1490.

M. Zanuso et al., "Noise Analysis and Minimization in Bang-Bang Digital PLLs", IEEE Transactions and Circuits and Systems II, Nov. 2009, vol. 56, No. 11, pp. 835-839.

N. Da Dalt, "A Design-Oriented Study of the Nonlinear Dynamics of Digital Bang-Bang PLLs", IEEE Transactions and Circuits and Systems I, Jan. 2005, vol. 52, No. 1, pp. 21-31.

N. Da Dalt, "Theory and Implementation of Digital Bang-Bang Frequency Synthesizers for high speed serial data communication", Diplom-Ingenieur Dissertation, Feb. 2007.

N. Pavlvovic et al.,"A 5.3GHz Digital-to-Time-Converter-Based Fractional-N All Digital PLL", ISSCC, Dig. Tech. Papers, 2011, pp. 54-56.

R.B. Staszewski et al., "All Digital PLL and Transmitter for Mobile Phones", IEEE J. Solid State Circuits, Dec. 2005, vol. 40, No. 12, pp. 2469-2482.

T. Tokairin et al., "A 2.1-to-2.8GHz All-Digital Frequency Synthesizer with a Time-Windowed TDC", ISSCC, Dig. Tech. Papers, 2010, pp. 470-472.

\* cited by examiner

*Primary Examiner* — Adam Houston

(74) *Attorney, Agent, or Firm* — Kauth, Pomeroy, Peck & Bailey LLP

(57) ABSTRACT

Systems and methods for generating a thermometer sigma delta encoded frequency control word for controlling a digitally controlled oscillator in accordance with embodiments of the invention are disclosed. In one embodiment, an all digital phase locked loop for generating an output clock signal includes a thermometer pulse coder configured to generate a frequency control word (FCW) that includes thermometer coded signals and a pulse modulated dither signal, and transmit the pulse modulated dither signal over a selected FCW signal line and transmit the thermometer coded signals over other FCW signal lines, and a digitally controlled oscillator to receive a FCW comprising a combined thermometer and pulse modulated signal and generate an output clock signal.

17 Claims, 9 Drawing Sheets

| thermfcw[6] | 0 | 0 | 0 | 0 | 0 | 0 | 0 | 1 |
|---|---|---|---|---|---|---|---|---|
| thermfcw[5] | 0 | 0 | 0 | 0 | 0 | 0 | 1 | 1 |
| thermfcw[4] | 0 | 0 | 0 | 0 | 0 | 1 | 1 | 1 |
| thermfcw[3] | 0 | 0 | 0 | 0 | 1 | 1 | 1 | 1 |
| thermfcw[2] | 0 | 0 | 0 | 1 | 1 | 1 | 1 | 1 |
| thermfcw[1] | 0 | 0 | 1 | 1 | 1 | 1 | 1 | 1 |
| thermfcw[0] | 0 | 1 | 1 | 1 | 1 | 1 | 1 | 1 |
| dither | s | s | s | s | s | s | s | s |
| Binfcw → | 0-1 | 1-2 | 2-3 | 3-4 | 4-5 | 5-6 | 6-7 | 7-8 |

0 = off
1 = on
S = sigma delta or pulse density coding

| thermfcw[7] | 0 | 0 | 0 | 0 | 0 | 0 | 0 | s |
|---|---|---|---|---|---|---|---|---|
| thermfcw[6] | 0 | 0 | 0 | 0 | 0 | 0 | s | 1 |
| thermfcw[5] | 0 | 0 | 0 | 0 | 0 | s | 1 | 1 |
| thermfcw[4] | 0 | 0 | 0 | 0 | s | 1 | 1 | 1 |
| thermfcw[3] | 0 | 0 | 0 | s | 1 | 1 | 1 | 1 |
| thermfcw[2] | 0 | 0 | s | 1 | 1 | 1 | 1 | 1 |
| thermfcw[1] | 0 | s | 1 | 1 | 1 | 1 | 1 | 1 |
| thermfcw[0] | s | 1 | 1 | 1 | 1 | 1 | 1 | 1 |
| Binfcw → | 0-1 | 1-2 | 2-3 | 3-4 | 4-5 | 5-6 | 6-7 | 7-8 |

0 = off
1 = on
S = sigma delta or pulse density coding

DIGITALLY CONTROLLED OSCILLATOR WITH THERMOMETER SIGMA DELTA ENCODED FREQUENCY CONTROL WORD

CROSS-REFERENCE TO RELATED APPLICATIONS

The current application claims priority to U.S. Provisional Patent Application No. 61/533,768, filed Sep. 12, 2011, the disclosure of which is incorporated herein by reference.

FIELD OF THE INVENTION

The present invention relates to digitally controlled oscillators and more specifically to controlling the frequency output of digitally controlled oscillators.

BACKGROUND OF THE INVENTION

Digitally controlled oscillators (DCOs) are commonly used in all-digital phase locked loops (ADPLLs). The frequency of the output of a DCO is typically determined by a digital frequency control word (FCW) that is provided as an input to the DCO. In many instances, the output frequency (F) of a DCO is determined as follows $F=F_0+\alpha*w$ (FCW), where $F_0$ is the oscillator frequency of a reference clock signal provided as an input to the DCO, $\alpha$ is the frequency gain of the DCO, and w is a weighting factor for the inputs of the FCW.

The frequency control word can have any number of signals and these signals can have any weighting applied to them. The number of signals in the frequency control word is typically related to the frequency resolution and range of the DCO. The signal weighting determines the linearity of the frequency control of the DCO. In many DCOs, a thermometer weighting is used where each signal results in the same frequency change. This increases the likelihood of monotonicity and limits non-linearity based upon the extent to which the manufacturing process can match individual elements used to control the signal on each input line of the thermometer input. Typical DCO implementations are illustrated in FIGS. 1A and 1B. The DCO in FIG. 1A receives an N bit FCW that is used to determine the frequency to output. The DCO in FIG. 1B receives a FCW that includes a coarse (or zone) tuning control signal, an integral tuning control signal, a proportional tuning control signal, and a dither signal.

When using a thermometer coded input, the minimum resolution of the FCW signal is limited by practical issues such as reasonably implementable minimum capacitor sizes and/or current sources. In a number of DCO implementations, a separate signal (or bus) is provided (often called a dither) on which a coding scheme including (but not limited to) pulse density or sigma delta coding is used to generate a finer resolution. An implementation utilizing a thermometer coded frequency code word in conjunction with a dither signal is illustrated FIG. 1C. A binary encoded FCW is split into most signficant bits binfcw_msbs and least significant bits binfcw_lsbs. The signal binfcw_msbs is encoded by a thermometer coder into FCW thermfcw in N bit thermometer code. The signal binfcw_lsbs is encoded using a sigma delta coder into a one bit dither. The dither signal is typically handled in the DCO by a separate array of capacitors.

SUMMARY OF THE INVENTION

Systems and methods for generating a thermometer sigma delta encoded frequency control word for controlling a digitally controlled oscillator in accordance with embodiments of the invention are disclosed. In one embodiment, an all digital phase locked loop (ADPLL) for generating an output clock signal from a reference clock signal includes a thermometer pulse coder including a plurality of frequency control word signal lines, where the thermometer pulse coder is configured to generate a frequency control word from a binary encoded frequency control word, where the frequency control word includes a plurality of thermometer coded signals and a pulse modulated dither signal, and select one of the plurality of frequency control word signal lines and transmit the pulse modulated dither signal over the selected frequency control word signal line and transmit the thermometer coded signals over a plurality of the other frequency control word signal lines, a digitally controlled oscillator configured to receive a frequency control word comprising a combined thermometer and pulse modulated signal via the plurality of frequency control world signal lines and generate an output clock signal at a frequency determined using at least the frequency control word, a feedback divider configured to receive the output clock signal from the digitally controlled oscillator and generate a feedback signal, and a phase detector configured to receive a reference clock signal and a feedback signal from the feedback divider and generate a phase error signal, which is provided to a digital loop filter configured to generate a binary encoded frequency control word that is input to the thermometer pulse coder.

In a further embodiment, the thermometer pulse coder also includes a thermometer coder configured to generate a plurality of thermometer coded signals and a pulse modulation coder configured to generate a pulse modulated dither signal.

In another embodiment, the pulse modulation coder is configured to generate a sigma delta coded dither signal using sigma delta coding.

In a still further embodiment, the thermometer pulse coder also includes a plurality of line encoders configured to receive at least two of the plurality of thermometer coded signals and the pulse modulated dither signal, and determine, based upon the values on the received thermometer coded signals, whether to output one of the received thermometer coded signals or the received pulse modulated dither signal.

In still another embodiment, at least one of the line encoders includes an AND gate that receives a first of the plurality of thermometer coded signals and a second of the plurality of thermometer coded signals, and a MUX that receives the output of the AND gate, the first of the plurality of thermometer coded signals, and the pulse modulated dither signal, and is configured to output either the first of the plurality of thermometer coded signals or the pulse modulated dither signal based upon the output of the AND gate.

In a yet further embodiment, the phase detector is a bang-bang phase detector.

In yet another embodiment, the ADPLL also includes a prescaler configured to receive the output clock signal from the digitally controlled oscillator and scale the frequency of the output clock signal.

In a further embodiment again, the feedback divider is a programmable integer N feedback divider.

In another embodiment again, the received reference clock signal is 25 Hz, the digitally controlled oscillator produces an output frequency 240 times greater than the reference clock signal, the prescaler divides the output clock signal frequency by two, and the feedback divider multiplies the received output clock signal by 2/240.

In a further additional embodiment, the digital loop filter includes an integral phase error path that is configured to receive the phase error from the phase detector and has an adjustable gain, and a frequency error path that is configured to receive the reference clock signal and a signal from the feedback divider and has an adjustable gain.

In another additional embodiment, the ADPLL also includes a state machine configured to control zone frequency tuning.

In a still yet further embodiment, the digitally controlled oscillator is an inductor-capacitor oscillator.

In still yet another embodiment, the digitally controlled oscillator includes a zone capacitor array, a fine frequency tuning capacitor array, and a proportional tuning capacitor array.

In a still further embodiment again, the zone capacitor array includes metal-to-metal capacitors.

In still another embodiment again, the fine frequency tuning capacitor array includes NMOS varactors.

In a still further additional embodiment, the proportional tuning capacitor array includes metal-to-metal capacitors and binary weighted NMOS varactors.

In still another additional embodiment, the digitally controlled oscillator also includes a proportional-to-absolute-temperature circuit.

BRIEF DESCRIPTION OF THE DRAWINGS

FIG. 4 illustrates how FCWs may be encoded using conventional thermometer and sigma delta encoding.

FIG. 6 illustrates how FCWs may be encoded using combined thermometer and sigma delta encoding in accordance with embodiments of the invention.

DETAILED DISCLOSURE OF THE INVENTION

Systems and methods in accordance with embodiments of the invention utilize a Digitally Controlled Oscillator (DCO) having a frequency control word (FCW) input combining thermometer and sigma delta coding to obtain monotonic frequency control and stable jitter performance. In systems that utilize a separate dither signal, mismatch between the separate capacitor or current source that is utilized on the dither input and the capacitors and/or current sources within the lines utilized by the thermometer coded input can result in non-linearities and non-monotonicities. Performance around the thermometer FCW signals may thus be degraded. When a coding scheme such as (but not limited to) pulse density or sigma delta coding is utilized on the highest activated thermometer coded frequency control word signal, the errors associated with mismatch are avoided. Alternatively, pulse density or sigma delta coding can be utilized on the lowest non-active thermometer coded frequency word signal. Embodiments of the invention can offer improved monotonicity and constant performance throughout the frequency control range.

Figure 1A:
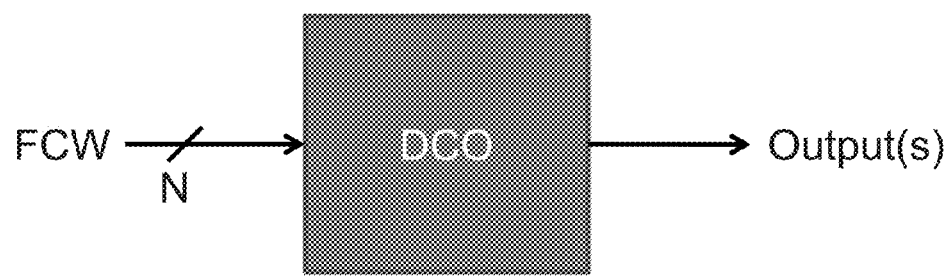
FIG. 1A is a conceptual illustration of a typical digitally controlled oscillator (DC) having an N bit frequency control word (FCW).
Figure 1B:
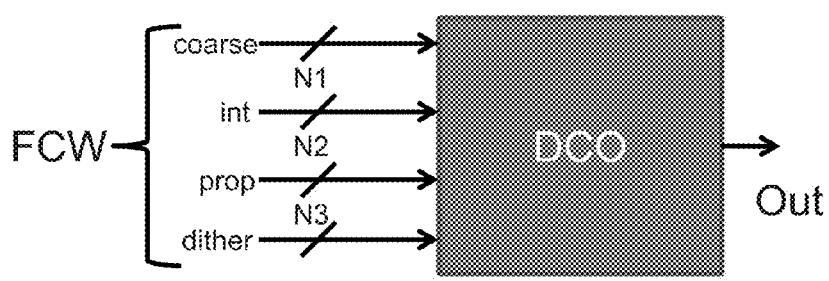
FIG. 1B is a conceptual illustration of a typical DCO having a FCW with N1 bit coarse frequency control, N2 bit integral frequency control, N3 bit proportional frequency control, and dither.
Figure 1C:
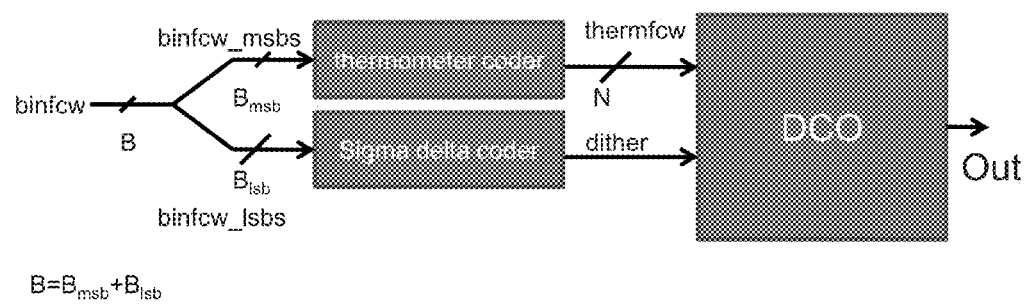
FIG. 1C is a conceptual illustration of a typical DCO receiving a FCW that includes an N bit thermometer code from a thermometer coder and a dither from a sigma delta coder.
Figure 2:
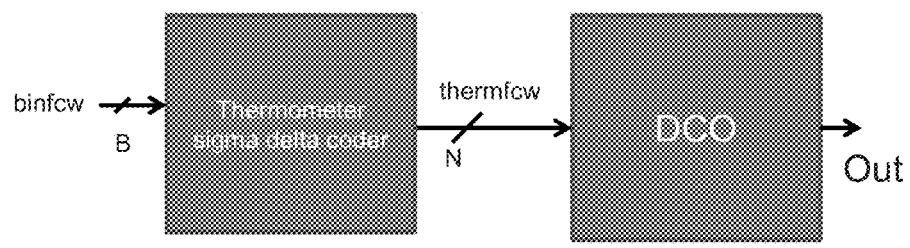
FIG. 2 is a conceptual illustration of a thermometer pulse coder providing a combined thermometer and sigma delta coded FCW to a DCO in accordance with embodiments of the invention.

In various embodiments of the invention, a combined thermometer and sigma delta coded input or bus is generated by performing sigma delta coding on the last activated thermometer weighted FCW signal. Thus, each signal is capable of at least the states of: on, off, and sigma delta. Digital logic circuitry that combine signals in this manner can be referred to as a thermometer pulse coder. FIG. 2 is a conceptual illustration of a thermometer pulse coder providing a combined thermometer and sigma delta coded FCW to a DCO in accordance with several embodiments of the invention. As will be discussed further below, sigma delta coding is one example of a pulse modulation scheme that can be utilized by a thermometer pulse coder. A thermometer pulse coder in various embodiments of the invention may utilize other types of pulse modulation.

Combined Thermometer and Signal Delta Coding

Thermometer code is an encoding that represents a natural number n with n ones, and can be either preceded by or followed by zeroes. Alternatively, the encoding can use n-1 ones, or n or n-1 zeroes without loss of generality. The string of ones can be padded with zeroes when code words of uniform length are desired.

Sigma delta coding is a method for encoding an analog or higher-resolution digital signal by converting the signal into a lower-resolution (e.g., binary) digital signal. The conversion is typically done using error feedback, where the difference between the input signal and the output signal is measured and used to improve the conversion. The low-resolution signal typically changes more quickly than the high-resolution signal, and it can be filtered to recover the high-resolution signal with little or no loss of fidelity. In many embodiments, the output of delta sigma coding can be thought of as pulses or a pulse stream, where the frequency of pulses or the pulse width is proportional to the amplitude or value of the input.

Sigma delta is one type of pulse modulation scheme in which an analog or higher-resolution digital signal is converted into a lower-resolution digital signal. The output signal is typically a two-level signal generated by modulating a pulse wave. One skilled in the art will recognize that many such pulse modulation schemes can often be used interchangeably to convert and communicate signals in a similar manner. Thus, the combined thermometer and sigma delta coded input generated by a thermometer pulse coder disclosed herein is not limited to sigma delta encoding, but may effectively utilize various other coding methods that encode an analog or higher-resolution digital signal into a lower-resolution digital signal, such as pulse density modulation and pulse code modulation. The conversion of one signal type to another may be known as or referred to variously as coding, encoding, and/or modulation (e.g., sigma delta modulation).

FIGS. 3-6 present examples of frequency control word signals using conventional coding schemes compared with signals using a combined thermometer and sigma delta coding scheme in accordance with various embodiments of the invention.

Figure 3:
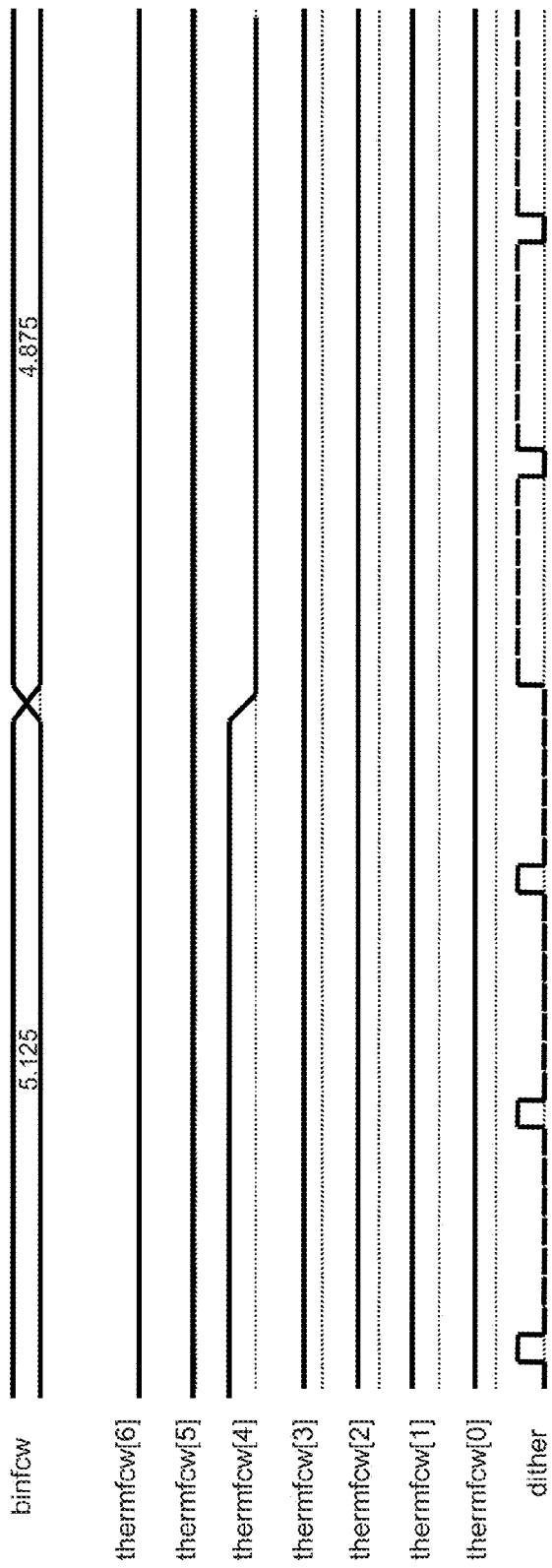
FIG. 3 illustrates example FCWs using conventional thermometer and sigma delta encoding.

In the example illustrated in FIG. 3, a frequency control word (FCW) has a value of 5.125, changing to 4.875. The integer portion of the FCW, which can be represented as three binary digits, is thermometer coded on signal lines thermfcw[0] to thermfcw[6]. The fractional portion of the FCW, which can be represented as three binary digits as a fraction of ⅛, is pulse modulated on the dither signal line. For the FCW of 5.125, the thermometer representation is 0011111 (signal lines thermfcw[0] through thermfcw[4] are high) with a dither of 0.125 or equivalently ⅛ (dither signal line is pulse modulated to be high ⅛ of the time). For the FCW of 4.875, the thermometer representation is 0001111 (signal lines thermfcw[0] through thermfcw[3] are high) with a dither of 0.875 or equivalently ⅞ (dither signal line is pulse modulated to be high ⅞ of the time).

A chart showing how FCW values may be coded according to a conventional coding scheme with separate thermometer and sigma delta coded signal lines is illustrated in FIG. 4. A value greater than or equal to 0 and less than 1 is coded with all thermometer signal lines low and a pulse modulated dither (such as sigma delta coding) on the dither signal line. A value greater than or equal to 1 and less than 2 is coded with thermometer signal line thermfcw[0] high and the remaining thermometer signal lines low, and a pulse modulated dither (such as sigma delta coding) on the dither signal line. Other values are coded in similar fashion.

Figure 5:
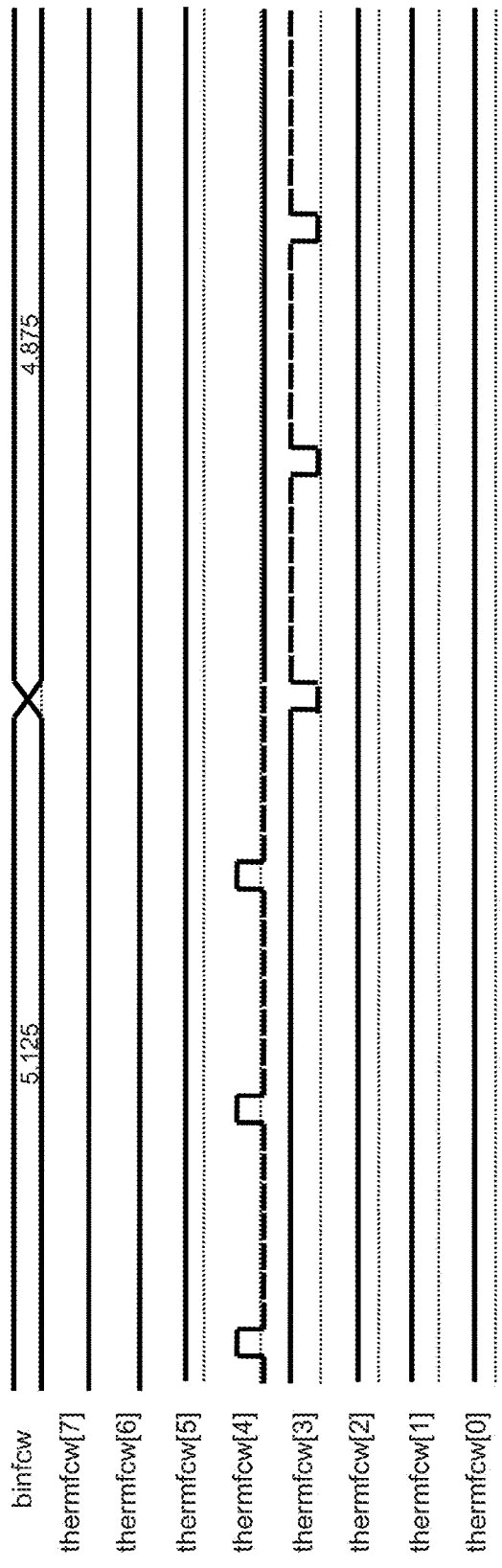
FIG. 5 illustrates example FCW using combined thermometer and sigma delta encoding in accordance with embodiments of the invention.

In the example illustrated in FIG. 5, FCWs of 5.125 and 4.875 are shown using combined thermometer and sigma delta coding in accordance with various embodiments of the invention. For the FCW of 5.125, the thermometer representation is 0011111 (signal lines thermfcw[0] through thermfcw[4] are activated) with a dither of 0.125 or equivalently ⅛ (dither signal line is pulse modulated to be high ⅛ of the time) on the highest activated thermometer signal line thermfcw[4]. For the FCW of 4.875, the thermometer representation is 0001111 (signal lines thermfcw[0] through thermfcw[3] are activated) with a dither of 0.875 or equivalently ⅞ (dither signal line is pulse modulated to be high ⅞ of the time) on the highest activated thermometer signal line thermfcw[3].

A chart showing how FCW values may be coded using a combined thermometer and sigma delta coding scheme in accordance with embodiments of the invention is illustrated in FIG. 6. A value greater than or equal to 0, and less than 1, is coded with all thermometer signal lines low and a pulse modulated dither (such as sigma delta coding) on the thermfcw[0] signal line. A value greater than or equal to 1, and less than 2, is coded with thermometer signal line thermfcw[0] high and the rest of the thermometer signal lines low, and a pulse modulated dither (such as sigma delta coding) on the thermfcw[1] signal line. Other values are coded in similar fashion. One skilled in the art will recognize the scheme may be modified in accordance with embodiments of the invention to provide different resolutions. For example, the number of thermometer signal lines or the duty cycle of the dither signal may be varied or other pulse modulation methods may be utilized to generate the dither signal.

Figure 7:
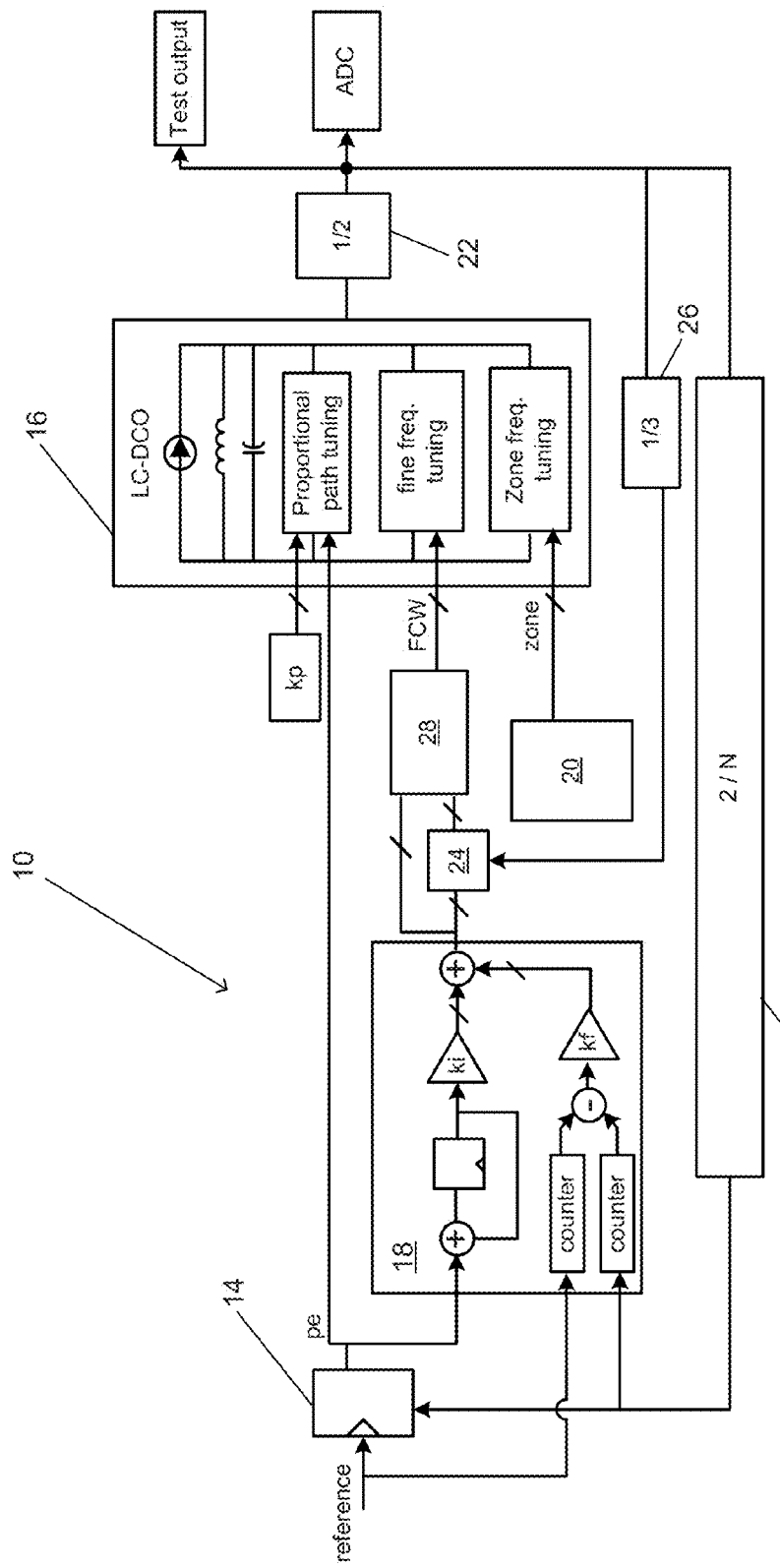
FIG. 7 is a conceptual illustrates of an all digital phase locked loop architecture having a thermometer pulse coder providing a combined thermometer and sigma delta coded FCW in accordance with embodiments of the invention.

All Digital Phase Locked Loop with Combined Thermometer and Sigma Delta Coded FCW for DCO Control In many embodiments of the invention, a thermometer pulse coder can provide a combined thermometer and sigma delta coded FCW input to a digitally controlled oscillator (DCO) in an all-digital phase-locked loop (ADPLL). An ADPLL 10 utilizing a combined thermometer and sigma delta coded input to a DCO in accordance with several embodiments of the invention is illustrated in FIG. 7. The ADPLL illustrated in FIG. 7 may be used to generate the clock for a 12-bit 3-GS/s ADC with an aperture uncertainty less than 300 fs RMS integrated beyond 1 MHz. A programmable integer-N feedback divider 12 together with a bang-bang phase detector (BB-PD) 14 may be used to enable 5.4, 6 and 6.4 GHz triple-band operation from a single 25 MHz reference clock. In several embodiments, an LC-based (inductor-capacitor) DCO 16 is used as it has various advantages compared to a ring oscillator solution. First, it can have better out-of-band phase noise for a given power consumption, which enables the use of a cost-efficient low frequency reference clock. Second, it can more easily facilitate direct digital frequency tuning by switching on and off capacitors as opposed to delay cells. This eliminates the need for current or voltage digital to analog converters (DAC), further embracing the all-digital PLL advantages, such as noise immunity, robust performance, and easy porting between technologies.

The BB-PD 14 provides a 1-bit early-late phase error (pe) signal by sampling the feedback clock from the feedback divider 12 with the reference clock, and feeds it to both the proportional and integral paths of the loop filter. The gain of the proportional path (kp) is programmable and implemented within the DCO 16 to ensure low latency, as the output jitter of a digital bang-bang PLL may increase linearly with the proportional path latency. The digital loop filter 18 contains the integral phase error path as well as a frequency error path, with variable modes for frequency acquisition and tracking and adjustable gains for the phase and frequency errors (ki and kf). The PLL state machine 20 starts with frequency zone searching, then changes to frequency acquisition and finally reaches the phase and frequency locked operating state. In many embodiments, the state machine 20 controls zone frequency tuning in the DCO 16 using a four bit bus to address four frequency zones (i.e., ranges). In different states, the gains kf, ki and kp are set accordingly for fast frequency acquisition and minimizing output jitter, while maintaining loop stability. The prescaler 22 divides the output frequency of the DCO 16 by two to generate the sampling clock for the ADC.

BB-PLL output jitter is typically dominated by either the limit cycle errors or the DCO phase noise, when the reference clock is sufficiently clean. The limit cycle errors are often proportional to the gain kp, while the DCO phase noise suppression is typically inversely proportional to kp. Therefore, if $\sigma_{p\text{-}j,dco}$ is the period jitter of the free running DCO and N is the feedback divider ratio, the output jitter can be minimized to $\sigma_{jitter,rms} \approx \text{sqrt}(N) * \sigma_{p\text{-}j,dco}$ by choosing an optimal time step of kp $\sigma_{p\text{-}j,dco}$/sqrt(N). A large feedback divider ratio N leads to a smaller kp, and results in more output jitter. With a 25 MHz reference clock and operation at 6-GHz, N should be 240. In order to achieve sub-300fs rms jitter, $\sigma_{p\text{-}j,dco}$ should be smaller than 20fs, and the kp time step is sqrt(240) smaller or should be less than 1.3fs, which is equivalent to a 47 kHz frequency step. The quantization noise of the integral path should be smaller than the proportional path kp. A key challenge is achieving such small tuning granularity while still tuning monotonically from the integral path.

Many conventional PPLs utilize a separate sigma-delta coder/modulator (AIM) dither in fine integral path tuning as discussed further above. However, the mismatch between the dither-controlled element and the integer elements can cause non-linearity and non-monotonicity, resulting in a significant noise increase when the integer control jumps between two adjacent codes. A solution in accordance with embodiments of the invention is to perform the dithering on the last activated thermometer weighted frequency control word (FCW) signal generated by the integral path using a thermometer pulse coder. This provides monotonic control and stabilizes the jitter performance over the whole frequency range. In many embodiments, a FCW tuning range of ±2% (240 MHz) is chosen to track environmental changes. This range can be addressed using 13-bit resolution as will be described below with reference to the ADPLL illustrated in FIG. 7.

Referring again to FIG. 7, the 24-bit integrator outputs from the integral phase error path (after scaling by ki) and frequency error path (after scaling by kf) are added and truncated to 16 bits. The least significant nine bits are fed to a $1^{st}$-order $\Delta\Sigma M$ 24 clocked at 1 GHz, with an oversampling rate (OSR) of 40, that provides 6 bits of resolution as pulses, i.e. a pulse stream, over a 1 bit bus. The 1 GHz clock for $\Delta\Sigma M$ 24 is received from the output of the prescaler 22 (3 GHz is this embodiment) that is further reduced by ⅓ using the prescaler 26. The seven most significant bits of the 16 bits and the $\Delta\Sigma M$ output are combined using a thermometer pulse coder 28 to provide a 128 bit combined thermometer and sigma delta coded FCW to the fine frequency tuning section of the DCO 16. The FCW may be used to control 128 equally sized FCW capacitors in the DCO 16. As can be appreciated by those skilled in the art, the circuitry and busses discussed may be modified to accommodate various bit lengths and resolutions. The illustrated embodiment depicts certain circuitry and layout. However, one skilled in the art will recognize that alternative components and layout of the components, such as for zone frequency tuning control, proportional path tuning control, integral path for fine frequency tuning, feedback path, and prescalers, may be utilized in an ADPLL in accordance with embodiments of the invention. For example, a derivative term or path may also be used in feedback control. Furthermore, a DCO may be implemented without all tuning paths illustrated here or with alternative types of tuning. One skilled in the art will recognize that a combined thermometer and sigma delta coded FCW and/or thermometer pulse coder may be used with other types of tuning on a DCO. Circuitry that may be used to implement a thermometer pulse coder 28 in accordance with embodiments of the invention is described below.

Thermometer Pulse Coder to Generate Combined Thermometer and Sigma Delta Code

Figure 8:
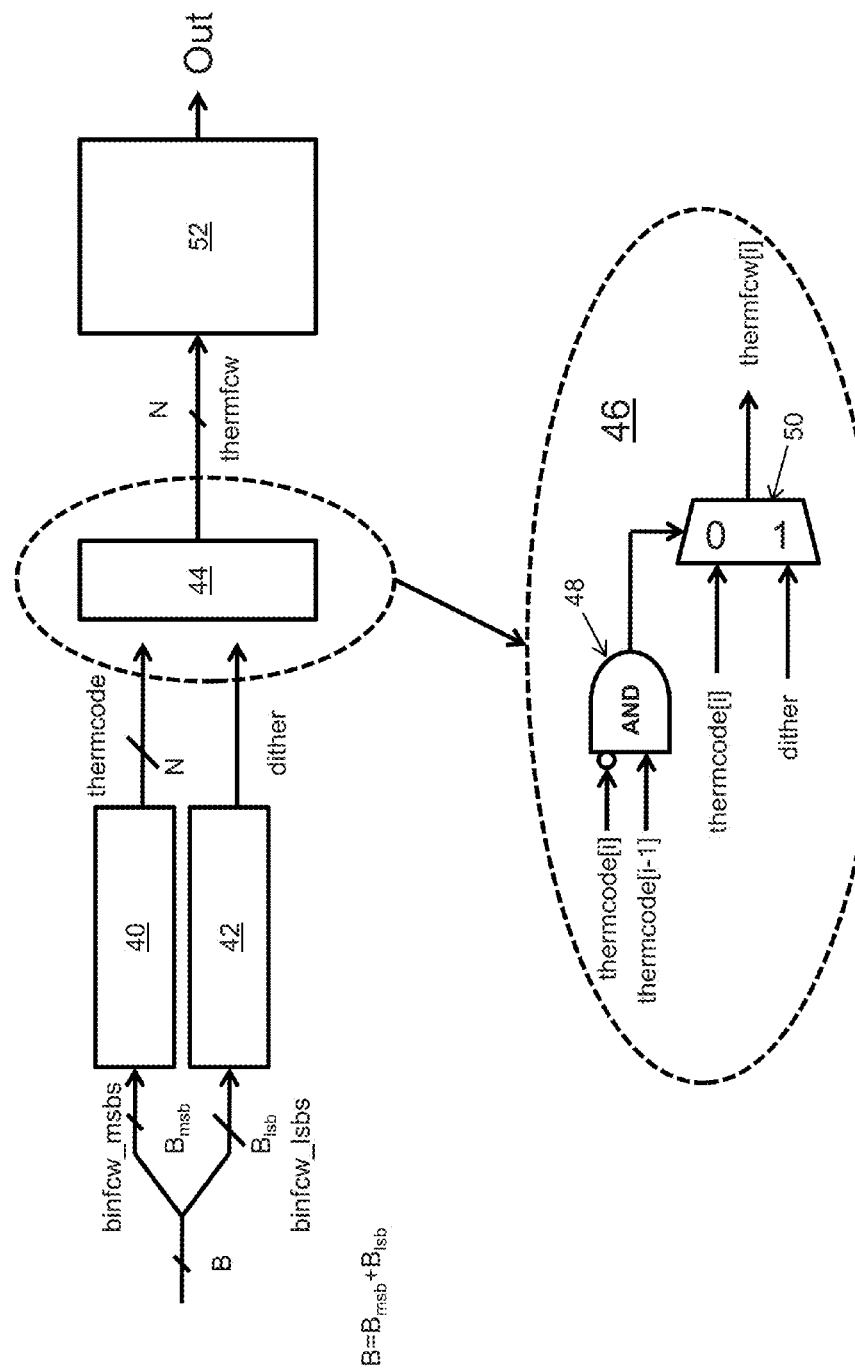
FIG. 8 is a conceptual illustration of a thermometer pulse coder architecture in accordance with embodiments of the invention.

In many embodiments of the invention, a thermometer pulse coder may be implemented using logic circuitry including (but not limited to) inverters, AND gates, and/or multiplexers (MUX). A thermometer pulse coder using logic circuitry in accordance with several embodiments of the invention is conceptually illustrated in FIG. 8. In the illustrated embodiment, the thermometer coder 40 receives a set of most significant bits binfcw_msbs of a FCW B and outputs an N bit thermometer code thermcode. A sigma delta coder 42 receives a set of least significant bits binfcw_lsbs of FCW B and outputs a dither signal. In the embodiments discussed above with reference to FIG. 7, a 16 bit FCW is separated into seven high bits and nine low bits. As discussed further above, greater or fewer bits may be used as appropriate for the application and other pulse modulation coding schemes such as pulse density coding may be used in embodiments of the invention.

The thermometer thermcode and dither signal are combined using the thermometer pulse coder 44. The thermometer pulse coder 44 may include N input lines, where each input line includes line encoders 46. Each line encoder 46 may include an AND gate 48 that receives the inverted signal thermcode[i] and the signal thermcode[i-1], where i is the number for each signal line from 1 to N. The output of AND gate 48 is used as the selector for a MUX 50 that receives thermcode[i] (selected by 0) and the dither signal line (selected by 1). The output of the MUX is signal thermfcw[i] for signal line i. While a specific arrangement of logic circuitry is described, one skilled in the art will recognize that other embodiments of the invention may encompass similar arrangements that combine a sigma delta coded dither onto an activated or non-activated thermometer signal line. The N bit FCW thermfcw output from thermometer pulse coder 44 is sent to a DCO 52 to control the frequency of the DCO. The illustrated embodiment depicts certain logic circuitry and layout. However, one skilled in the art will recognize that other components and layout of the components may be utilized in thermometer pulse coder that generates a combined thermometer and sigma delta code in accordance with embodiments of the invention. As discussed further above, a dither signal may utilize pulse density or other pulse modulated encoding in other embodiments of the invention. Also as discussed above, a coding scheme in other embodiments of the invention may stipulate that the lowest non-active thermometer signal line carries the dither signal. One skilled in the art will recognize that a combined thermometer and sigma delta coded FCW can be generated in a variety of ways in various embodiments of the invention. DCOs that may receive signals from a thermometer pulse coder in accordance with embodiments of the invention are described below.

Figure 9:
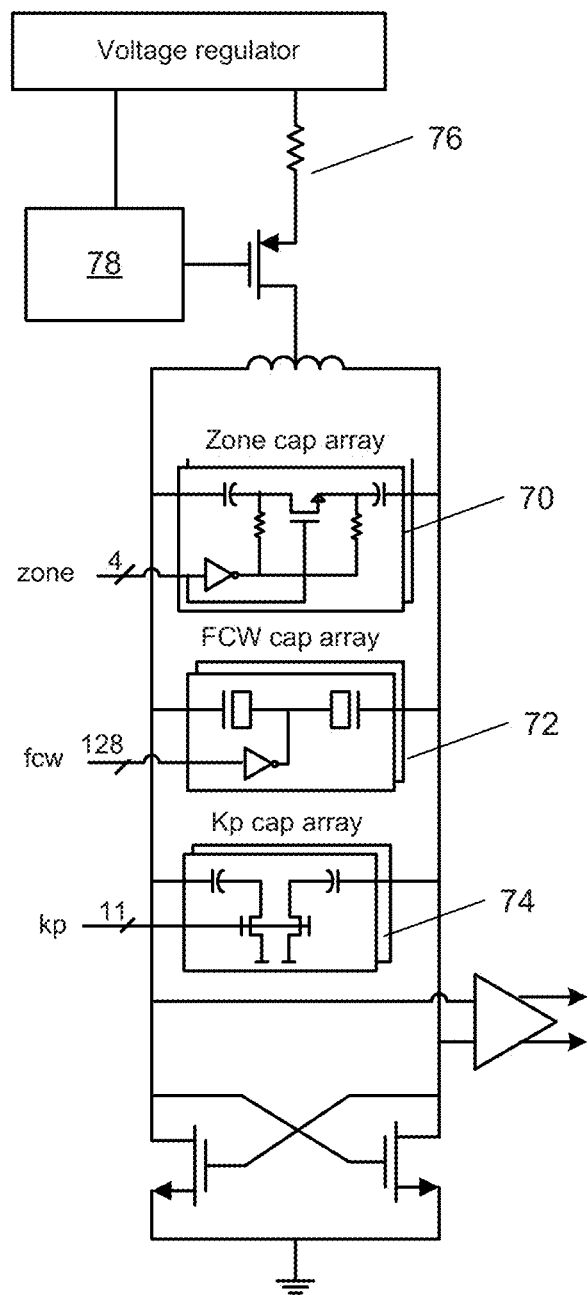
FIG. 9 is a conceptual illustration of a DCO architecture configured to receive a combined thermometer and sigma delta coded FCW in accordance with embodiments of the invention.

Digitally Controlled Oscillator Using Combined Thermometer and Sigma Delta Coded FCW In several embodiments of the invention, a digitally controlled oscillator (DCO) may include a zone capacitor array for zone acquisition, a FCW capacitor array for fine frequency tuning, and a kp capacitor array for proportional tuning A DCO with capacitor arrays in accordance with many embodiments of the invention is illustrated in FIG. 9.

The DCO illustrated in FIG. 9 has 4 binary weighted frequency zone adjustments to compensate up to ±15% of frequency range for process variations. The zone capacitors 70 contribute 70% of the LC-tank capacitance, and the FCW capacitors 72 and kp capacitors 74 contribute 10%, while the input capacitance of the sequence buffer and wiring parasitics account for the rest. Using metal-to-metal instead of MOS capacitors for the zone adjustment can significantly reduce the supply/ground voltage sensitivity, and thus lower the noise. The pull-up resistors 76 prevent tank quality factor (Q) degradation caused by the leakage of the floating nodes when the switch is OFF. In several embodiments, the FCW tuning capacitors 72 are NMOS varactors, utilizing their high capacitance density and high quality factor. In other embodiments, any of a variety of capacitor implementations appropriate to the requirements of a specific application can be utilized. The proportional path kp control 74 is composed of 6 metal-to-metal capacitors and 5 binary weighted NMOS varactors. The DCO tail current is generated from a proportional-to-absolute-temperature (PTAT) circuit 78 in order to maximize the DCO amplitude without saturating at any temperature, thus optimizing the noise performance. Although specific embodiments are illustrated, any of a variety of DCO types and DCO implementations can be utilized in combination with a thermometer pulse coder in accordance with embodiments of the invention.

In several embodiments, the ADPLL is fabricated in a SiGe BiCMOS 0.13 µm process and occupies an active area of 0.76 mm$^2$ (16% is used by regulators). Measurements are performed on 164-pin QLP packaged chips. The 25 MHz reference clock is supplied from an R&S SMA100A signal generator. The phase noise is measured as −88, −112, −132, −138 dBc/Hz at 100 k, 1 M, 10 M and 100 MHz offset frequencies respectively. The rms jitter is 1.1 ps integrated from 1 kHz to 1.5 GHz, and 270 fs integrated from 1 MHz to 1.5 GHz. The −68 dBc reference spur at 25 MHz and <−83 dBc divider spur at 300 MHz and 1 GHz are caused by insufficient isolation between the oscillator and the dividers. The spurs induced by the loop parameters are all below −88 dBc. Three 2.5V-to-1.5V on-chip voltage regulators supply the DCO and prescaler, phase detector and feedback dividers, and digital loop filters separately. The DCO and prescaler consume 24 mA, phase detector and feedback divider draw 18 mA and digitals including management data input/output dissipate 30 mA.

While the above description contains many specific embodiments of the invention, these should not be construed as limitations on the scope of the invention, but rather as an example of one embodiment thereof.

What is claimed is:

1. An all digital phase locked loop (ADPLL) for generating an output clock signal from a reference clock signal, the ADPLL comprising:
    a thermometer pulse coder including a plurality of frequency control word signal lines, where the thermometer pulse coder is configured to:
        generate a frequency control word from a binary encoded frequency control word, where the frequency control word includes a plurality of thermometer coded signals and a pulse modulated dither signal; and
        select one of the plurality of frequency control word signal lines and transmit the pulse modulated dither signal over the selected frequency control word signal line and transmit the thermometer coded signals over a plurality of the other frequency control word signal lines;
    a digitally controlled oscillator configured to receive a frequency control word comprising a combined thermometer and pulse modulated signal via the plurality of frequency control world signal lines and generate an output clock signal at a frequency determined using at least the frequency control word;
    a feedback divider configured to receive the output clock signal from the digitally controlled oscillator and generate a feedback signal; and
    a phase detector configured to receive a reference clock signal and a feedback signal from the feedback divider and generate a phase error signal, which is provided to a digital loop filter configured to generate a binary encoded frequency control word that is input to the thermometer pulse coder.

2. The phase locked loop of claim 1, wherein the thermometer pulse coder further comprises a thermometer coder configured to generate a plurality of thermometer coded signals and a pulse modulation coder configured to generate a pulse modulated dither signal.

3. The phase locked loop of claim 2, wherein the pulse modulation coder is configured to generate a sigma delta coded dither signal using sigma delta coding.

4. The phase locked loop of claim 2, wherein the thermometer pulse coder further comprises a plurality of line encoders configured to:
    receive at least two of the plurality of thermometer coded signals and the pulse modulated dither signal;
    determine, based upon the values on the received thermometer coded signals, whether to output one of the received thermometer coded signals or the received pulse modulated dither signal.

5. The phase locked loop of claim 4, wherein at least one of the line encoders comprises:
    an AND gate that receives a first of the plurality of thermometer coded signals and a second of the plurality of thermometer coded signals; and
    a MUX that receives the output of the AND gate, the first of the plurality of thermometer coded signals, and the pulse modulated dither signal, and is configured to output either the first of the plurality of thermometer coded signals or the pulse modulated dither signal based upon the output of the AND gate.

6. The phase locked loop of claim 1, wherein the phase detector is a bang-bang phase detector.

7. The phase locked loop of claim 1, further comprising a prescaler configured to receive the output clock signal from the digitally controlled oscillator and scale the frequency of the output clock signal.

8. The phase locked loop of claim 7, wherein the feedback divider is a programmable integer N feedback divider.

9. The phase locked loop of claim 8, wherein the received reference clock signal is 25 Hz, the digitally controlled oscillator produces an output frequency 240 times greater than the reference clock signal, the prescaler divides the output clock signal frequency by two, and the feedback divider multiplies the received output clock signal by $2/240$.

10. The phase locked loop of claim 1 wherein the digital loop filter comprises:
    an integral phase error path that is configured to receive the phase error from the phase detector and has an adjustable gain; and
    a frequency error path that is configured to receive the reference clock signal and a signal from the feedback divider and has an adjustable gain.

11. The phase locked loop of claim 1, further comprising a state machine configured to control zone frequency tuning.

12. The phase locked loop of claim 1, wherein the digitally controlled oscillator is an inductor-capacitor oscillator.

13. The phase locked loop of claim 1, wherein the digitally controlled oscillator comprises a zone capacitor array, a fine frequency tuning capacitor array, and a proportional tuning capacitor array.

14. The phase locked loop of claim 13, wherein the zone capacitor array comprises metal-to-metal capacitors.

15. The phase locked loop of claim 13, wherein the fine frequency tuning capacitor array comprises NMOS varactors.

16. The phase locked loop of claim 13, wherein the proportional tuning capacitor array comprises metal-to-metal capacitors and binary weighted NMOS varactors.

17. The phase locked loop of claim 13, wherein the digitally controlled oscillator further comprises a proportional-to-absolute-temperature circuit.

* * * * *